United States Patent
Campbell et al.

(10) Patent No.: US 7,206,203 B2
(45) Date of Patent: Apr. 17, 2007

(54) ELECTRONIC DEVICE COOLING ASSEMBLY AND METHOD EMPLOYING ELASTIC SUPPORT MATERIAL HOLDING A PLURALITY OF THERMALLY CONDUCTIVE PINS

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Robert E. Simons, Poughkeepsie, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 10/873,432

(22) Filed: Jun. 22, 2004

(65) Prior Publication Data

US 2005/0280993 A1 Dec. 22, 2005

(51) Int. Cl.
*H05K 7/20* (2006.01)
*H01L 23/34* (2006.01)
*H02G 3/03* (2006.01)
*F28F 7/00* (2006.01)

(52) U.S. Cl. .................. 361/699; 257/714; 174/15.1; 174/252; 165/80.4; 165/80.5

(58) Field of Classification Search ............. 361/699; 257/714; 174/15.1, 252; 165/80.4, 80.5
See application file for complete search history.

(56) References Cited

U.S. PATENT DOCUMENTS

| | | | |
|---|---|---|---|
| 3,706,127 A | 12/1972 | Oktay et al. ............... 29/576 |
| 4,109,707 A * | 8/1978 | Wilson et al. ............... 165/46 |
| 5,083,194 A | 1/1992 | Bartilson ..................... 357/81 |
| 5,299,090 A | 3/1994 | Brady et al. ................ 361/703 |
| 6,366,462 B1 | 4/2002 | Chu et al. .................. 361/699 |
| 6,397,932 B1 * | 6/2002 | Calaman et al. .......... 165/80.4 |

(Continued)

OTHER PUBLICATIONS

"Microfin Cooling", IBM Technical Disclosure Bulletin, vol. 34, No. 3, Aug. 1991, pp. 424-426.

(Continued)

*Primary Examiner*—Lisa Lea-Edmonds
*Assistant Examiner*—Zachary Pape
(74) *Attorney, Agent, or Firm*—Lily Neff, Esq.; Kevin P. Radigan, Esq.; Heslin Rothenberg Farley & Mesiti, P.C.

(57) ABSTRACT

An electronic device cooling assembly and fabrication method are provided which include a manifold with an orifice for injecting a cooling liquid onto a surface to be cooled, and an elastic pin support material with an opening aligned to the orifice of the manifold. Multiple thermally conductive pins are mounted within the support material, extending therefrom, and are sized to physically contact the surface to be cooled. The support material has a thickness and compliance which facilitates thermal interfacing of the pins to the surface by allowing second ends thereof to move vertically and tilt. The second end of each pin has a planar surface which is normal to an axis of the pin, and the support material facilitates the planar surfaces of the second pin ends establishing planar contact with the surface to be cooled, notwithstanding that the surface may be other than planar.

26 Claims, 4 Drawing Sheets

U.S. PATENT DOCUMENTS

| | | | |
|---|---|---|---|
| 6,431,260 B1 | 8/2002 | Agonafer et al. | 165/8.4 |
| 6,519,151 B2 | 2/2003 | Chu et al. | 361/699 |
| 6,587,345 B2 | 7/2003 | Chu et al. | 361/719 |
| 6,625,023 B1 | 9/2003 | Morrow et al. | 361/700 |
| 7,133,286 B2 * | 11/2006 | Schmidt et al. | 361/718 |
| 2004/0012914 A1 | 1/2004 | Chu et al. | 361/679 |
| 2005/0224212 A1 * | 10/2005 | East | 165/80.4 |
| 2006/0042825 A1 * | 3/2006 | Lu et al. | 174/252 |
| 2006/0250773 A1 * | 11/2006 | Campbell et al. | 361/699 |

OTHER PUBLICATIONS

Chu, et al., "Direct Liquid Cooling of Computer Chips Using A Densely Packed Pin Fin Array and Controlled Radial Flow of a Dielectric Coolant", Research Disclosure, No. 320, Dec. 1990, 1 page.

* cited by examiner

ELECTRONIC DEVICE COOLING ASSEMBLY AND METHOD EMPLOYING ELASTIC SUPPORT MATERIAL HOLDING A PLURALITY OF THERMALLY CONDUCTIVE PINS

CROSS REFERENCE TO RELATED APPLICATION

This application contains subject matter which is related to the subject matter of the following application, which is assigned to the same assignee as this application and which is hereby incorporated herein by reference in its entirety:

"Electronic Device Substrate Assembly With Multilayer Impermeable Barrier And Method Of Making", Chu et al., Ser. No. 10/197,661, filed Jul. 17, 2002.

FIELD OF THE INVENTION

The present invention relates to heat transfer mechanisms, and more particularly, to heat transfer mechanisms and cooling assemblies for removing heat generated by an electronic device, and to methods of constructing such cooling assemblies. More particularly, the present invention relates to cooling assemblies with an elastic layer supporting a plurality of thermally conductive pins capable of vertical and tilt movements for facilitating physical, planar coupling of planar ends of the plurality of thermally conductive pins with a surface to be cooled.

BACKGROUND OF THE INVENTION

As is known, operating electronic devices produce heat. This heat should be removed from the devices in order to maintain device junction temperatures within desirable limits: failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Finally, as more and more devices are packed onto a single chip, power density (Watts/cm$^2$) increases, resulting in the need to remove more power from a given size chip or module. These trends have combined to create applications where it is no longer desirable to remove heat from modem devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling fluid. As is known, different fluids provide different cooling capabilities. In particular, fluids such as refrigerants or other dielectric fluids (e.g., fluorocarbon fluid) exhibit relatively poor thermal conductivity and specific heat properties, when compared to fluids such as water or other aqueous fluids. Dielectric fluids have an advantage, however, in that they may be placed in direct physical contact with electronic devices and interconnects without adverse affects such as corrosion or electrical short circuits. For example, U.S. Pat. No. 6,052,284, entitled "Printed Circuit Board with Electronic Devices Mounted Thereon", describes an apparatus in which a dielectric fluid flows over and around several operating electronic devices, thereby removing heat from the devices. Similar approaches are disclosed in U.S. Pat. No. 5,655,290, entitled "Method for Making a Three-Dimensional Multichip Module" and U.S. Pat. No. 4,888,663, entitled "Cooling System for Electronic Assembly".

Other cooling fluids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages", discloses the use of a conductive foil barrier; U.S. Pat. No. 4,879,629, entitled "Liquid Cooled Multi-chip Integrated Circuit Module Incorporating A Seamless Compliant Member for Leakproof Operation", and IBM Technical Disclosure Bulletin Vol. 20, No. 2, Jul. 1977, entitled "Liquid Cooled Module with Compliant Membrane", disclose the use of a flexible barrier with thermal conduction enhancements (thermal studs and heatsinks, respectively); and U.S. Pat. No. 4,381,032, entitled "Apparatus for Cooling High-Density Integrated Circuit Packages", and U.S. Pat. No. 5,294,830, entitled "Apparatus for Indirect Impingement Cooling of Integrated Circuit Chips", disclose the use of flexible barriers, where pistons are used to maintain contact between the barrier and the devices to be cooled. The above-incorporated, co-pending patent application entitled "Electronic Device Substrate Assembly With Mulilayer Impermeable Barrier and Method of Making", describes an electronic device substrate assembly with a multilayer impermeable barrier which provides high effective thermal conductivity between a device to be cooled and a water-based coolant, while simultaneously maintaining physical separation between the coolant and electronic devices and minimizing mechanical stresses caused by mismatches in the thermal coefficients of expansion of various materials within the device assembly.

SUMMARY OF THE INVENTION

One method for implementing direct water-based cooling from a heat transfer standpoint is to impinge one or more jets of coolant liquid onto a surface thermally coupled to an integrated circuit chip or electronic device to be cooled. In order to handle very high heat fluxes (e.g., 200 W/cm$^2$) with a reasonable liquid flow rate, the jet orifices would need to be spaced close together and be very small, for example, 0.25 mm diameter (or slot width) or less. A concern with such small orifices is that they may act to filter debris in the system, resulting in the orifices becoming plugged. The orifices would need to be both plentiful and small to achieve the high heat transfer coefficients needed to cool a limited size, flat surface. One might compensate by creating additional surface area in the chip (for example, by etching or otherwise removing chip material), or adding extended surfaces to the chip. Both require additional chip processing that is deemed undesirable in terms of risking the loss of expensive functional chips.

Therefore, a need exists for a practical cooling assembly and method which allows for high heat transfer from a surface of an electronic device to be cooled using a direct liquid coolant impingment approach, without using structures likely to be obstructed by debris in the system.

This need is met and additional advantages are provided through a cooling assembly for an electronic device. The cooling assembly includes a manifold having at least one orifice therein for injecting a cooling liquid onto a surface to be cooled, and an elastic pin support material. The surface to be cooled comprises either a surface of the electronic device or a surface in thermal contact with the electronic device. The elastic pin support material has at least one opening aligned to the at least one orifice of the manifold for allowing the cooling liquid to pass therethrough. A plurality of thermally conductive pins are mounted within the elastic pin support material and extend therefrom. The plurality of thermally conductive pins are sized to physically contact the surface to be cooled when the cooling assembly is employed to cool the electronic device, and include first ends embedded within the elastic pin support material. The elastic pin support material has a thickness and compliance which facilitates physical contact of the plurality of thermally conductive pins to the surface to be cooled by allowing second ends thereof to move vertically and tilt. The second end of each thermally conductive pin comprises a planar surface which is normal to an axis of the thermally conductive pin. When the cooling assembly is employed to cool the electronic device, the elastic pin support material facilitates the planar surfaces of the second ends of the pins establishing planar contact with the surface to be cooled, notwithstanding that the surface may be other than planar.

In another aspect, an electronic module is provided which includes a substrate having at least one electronic device to be cooled disposed thereon. A cooling assembly is provided for the at least one electronic device. This cooling assembly includes a manifold having at least one orifice therein for injecting a cooling liquid onto a surface to be cooled and an elastic pin support material. The surface to be cooled comprises either a surface of the electronic device or a surface in thermal contact with the electronic device. The elastic pin support material has an opening aligned to the orifice of the manifold for allowing the cooling liquid to pass therethrough. A plurality of thermally conductive pins are mounted within the support material and extend therefrom. The pins physically contact the surface to be cooled and include first ends embedded within the support material. The support material has a thickness and compliance which facilitates thermal interfacing of the pins to the surface to be cooled by allowing second ends thereof to move vertically and tilt. The second end of each thermally conductive pin has a planar surface which is normal to an axis of the thermally conductive pin. The elastic pin support material facilitates the planar surfaces of the second ends of the plurality of thermally conductive pins being in planar contact with the surface to be cooled, notwithstanding that the surface may be other than planar.

In a further aspect, a method of fabricating a cooling assembly for an electronic device is provided. The method includes providing a manifold having at least one orifice for injecting a cooling liquid onto a surface to be cooled, the surface comprising either a surface of the electronic device or a surface in thermal contact with the electronic device; and providing an elastic pin support material having a plurality of thermally conductive pins mounted therein and extending therefrom, the support material having an opening aligned to the orifice of the manifold for allowing the cooling liquid to pass therethrough. The conductive pins are sized to physically contact the surface to be cooled when the cooling assembly is employed to cool the electronic device. The support material has a thickness and compliance which facilitates thermal interfacing of the pins to the surface to be cooled by allowing second ends of the pins to move vertically and tilt. The second end of each thermally conductive pin comprises a planar surface which is normal to an axis of the thermally conductive pin. The elastic pin support material facilitates the planar surfaces of the second ends establishing planar contact with the surface to be cooled, notwithstanding that the surface may be other than planar.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Generally stated, provided herein is an enhanced cooling assembly and method which allows for high heat transfer from a surface in thermal contact with an electronic device to be cooled using a direct liquid coolant impinging approach. In one embodiment, the cooling liquid is assumed to comprise a water-based fluid, and the cooling assembly is employed in combination with a passivated electronic substrate assembly. Other cooling liquids could be employed, however.

The cooling assembly employs an elastic (i.e., low modulus of elasticity) pin support material, such as an elastomeric material or rubber-based material, to compliantly hold a plurality of thermally conductive pins. The plurality of thermally conductive pins are mounted within the support material and have second ends extending therefrom. The pins are sized to physically contact a surface to be cooled. The surface to be cooled can comprise either a surface of an electronic device itself, or a surface thermally coupled to the electronic device through which heat is extracted. The thickness and compliance of the support material are fabricated to a desired specification to allow the second ends of the pins to simultaneously translate vertically and tilt. The second end of each pin has a planar surface which is normal to an axis of the pin. When in use, the support material facilitates the planar surfaces of the second pin ends establishing planar contact with the surface to be cooled, notwithstanding that the surface may be other than a planar surface, for example, on a micron scale.

As a further enhancement, an exposed surface of the elastic pin support material may be tapered from a periphery thereof to a center region of the elastic pin support material. This tapering of the exposed surface forms a converging channel between the support material and the surface to be cooled from a center region of the elastic pin support material to a region near the periphery thereof. Additionally, or alternatively, density of the plurality of thermally conductive pins can increase from a center portion of the elastic pin support material to the periphery thereof to further enhance conduction and convection of heat from the surface to be cooled in regions near the periphery of the pin support material. It is assumed herein that the elastic pin support material is configured with a surface area approximating the surface area of the surface to be cooled so that when the cooling assembly is employed to cool the surface, the elastic pin support material with the plurality of thermally conductive pins projecting therefrom is aligned over the surface to be cooled.

Passivated Electronic Substrate Assembly

Figure 1A:
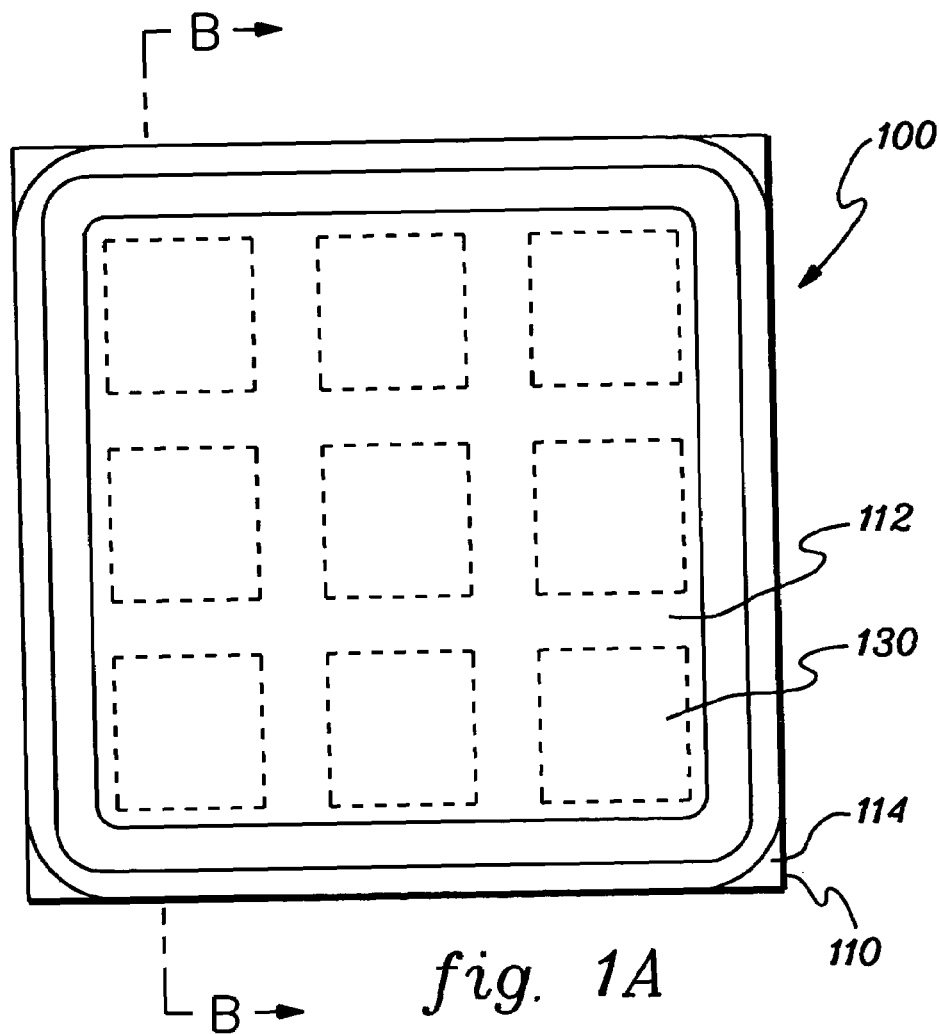
FIG. 1A depicts a top plan view of a passivated substrate assembly, in accordance with an aspect of the present invention.
Figure 1B:
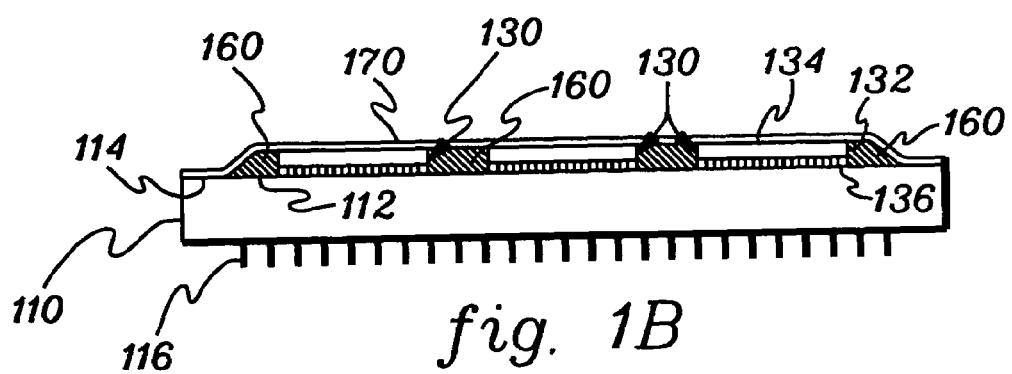
FIG. 1B depicts a cross-sectional view of the passivated substrate assembly shown in FIG. 1A, taken along line B—B.

FIGS. 1A and 1B illustrate a passivated substrate assembly, per one aspect of the present invention. As shown in FIGS. 1A and 1B, passivated substrate assembly 100 includes a substrate 110, and one or more electronic device assemblies 130. Substrate 110 includes an upper surface 112, to which device assemblies 130 are connected. Substrate upper surface 112 includes a perimeter area 114, surrounding the portion of substrate upper surface 112 that contains device assemblies 130. Substrate 110 further includes a plurality of external electrical connections, such as pins 116, as illustrated in FIG. 1B. In one embodiment of the present invention, substrate 110 is composed of ceramic or glass ceramic, however other substrate materials as known in the art may be advantageously used in conjunction with the teachings of the present invention.

As shown in FIG. 1B, electronic device assembly 130 includes an electronic device 132. Electronic device assembly 130 includes an upper surface 134, which, in this embodiment, is the upper surface of electronic device 132. Electronic device assembly 130 further includes electrical connections to substrate upper surface 112, such as solder ball connections 136 (also referred to herein as controlled collapse chip connections, or C4s). Alternatively, device 132 may be connected to substrate 112 through other means, such as wires or leads, provided some portion of device assembly upper surface 134 may be contacted by an electrically conductive material.

FIG. 1B further illustrates the multilayer passivation structure of the present invention. A first passivation layer 160 substantially occupies the volume adjacent to device assemblies 130, within the area bounded by substrate perimeter area 114, and extending vertically from substrate upper surface 112, to approximately the height of device assembly upper surface 134. As illustrated in FIG. 1B, first passivation layer 160 need not occupy the volume between devices 132 and substrate upper surface 112. First passivation layer 160 may, however, optionally occupy the volume between electronic device 132 and substrate upper surface 112, thereby substantially surrounding connections 136. A second passivation layer 170 is located above the first passivation layer and above the device assembly upper surfaces 134. Second passivation layer 170 is shown in contact with device upper surfaces 134, and thermally coupled thereto. Second passivation layer 170 is in contact with substrate perimeter area 114, and sealably affixed thereto.

The primary purpose of first passivation layer 160 is to provide mechanical support for second passivation layer 170. Layer 160 should adhere to substrate upper surface 112, and to device assembly 130. In particular, layer 160 should adhere to the sides of device assembly 130, without significant defects, such as gaps, cracks, voids, etc. The upper surface of layer 160 should be relatively smooth and continuous, without significant defects. Furthermore, the surface consisting of the upper surface of layer 160 and device upper surfaces(s) 134 should be relatively smooth and continuous, without significant defects or discontinuities. In this context, a defect or discontinuity is significant if it impairs the function of layer 170, such as by creating a defect (crack, gap, etc.) in layer 170 through which a cooling fluid might pass. Whether a particular effect is significant, therefore, is likely to depend on the properties of layer 170, such as the materials selected, thickness, number of sublayers, etc. Layer 160 should be a poor electrical conductor, since layer 160 may be in contact with connections 136, or electrical connections on substrate upper surface 112. In preferred embodiments, layer 160 is an electrical insulator. Layer 160 should further exhibit a low dielectric constant, since layer 160 is likely to be in direct or nearly direct contact with conductors on substrate surface 112, or optionally with connections 136, any of which may carry high frequency signals. The thermal transport properties of layer 160 are unimportant; as discussed below, thermal conduction is provided by layer 170. Layer 160 may be composed of a single layer, or multiple layers. Layer 160 may also be composed of a single material, or multiple materials. In general, layer 160 may be formed of a variety of materials, such as: silicones, acrylic elastomers, thermoplastic elastomers, thermoplastic copolymers, polysulfide polymers and polyurethanes, thermoplastic polyimides, photosensitive polyimides, polyethersulfones and epoxies. Alternatively, in embodiments of the present invention where layer 160 is formed of a plurality of materials, materials such as engineering glass or silicon may be used to form a portion of layer 160. Other materials having the properties described herein may be substituted by one of skill in the art, and are therefore within the spirit and scope of the present invention.

Layer 160, or a portion thereof, may optionally serve a second purpose, encapsulating connections 136 to reduce mechanical fatigue and extend the useful life of connections 136. Mechanical fatigue may be caused, for example, by subjecting assembly 100 to temperature fluctuations, since assembly 100 is most likely constructed of materials having varying thermal coefficients of expansion. In embodiments of the present invention where mechanical fatigue is a concern, an encapsulant such as, for example, an epoxy or a thermoplastic resin (such as polysulfone or polyetherimide) or other suitable encapsulant, may be used to form layer 160, or a portion thereof. Suitable encapsulants are described in, for example, U.S. Pat. No. 5,656,862, Papathomas et al., entitled "Solder Interconnection Structure", issued Aug. 12, 1997, U.S. Pat. No. 5,668,059, Christie et al., entitled "Solder Interconnection Structure and Process for Making", issued Sep. 16, 1997, and U.S. Pat. No. 5,659,203, Call et al., entitled "Reworkable Polymer Chip Encapsulant", issued Aug. 19, 1997, each of which is assigned to the same assignee as the present application and each of which is hereby incorporated herein by reference in its entirety. In such an embodiment, the encapsulant should substantially occupy the volume between electronic device 132 and substrate upper surface 112, thereby substantially surrounding connections 136. The remaining volume of layer 160 may be composed of the same encapsulating material, or may optionally be composed of one or more of the materials previously described (i.e., silicones, acrylic elastomers, thermoplastic elastomers, etc.).

Second passivation layer 170 serves two purposes. First, layer 170 provides an impermeable and corrosion resistant barrier, capable of being in direct contact with a cooling fluid such as water or other aqueous fluid. Second, layer 170 provides a high effective thermal conductivity path between device assembly upper surface 134 and a cooling fluid in contact with an upper surface of layer 170. In addition, layer 170 and its deposition methods should be compatible with layer 160. Each of these purposes, and the structural and material implications thereof, are discussed in detail in the above-incorporated U.S. patent application entitled "Electronic Device Substrate Assembly with Multilayer Impermeable Barrier and Method of Making".

Cooling Assembly with Elastic Pin Support

FIGS. 2–5 depict multiple embodiments of a cooling assembly and fabrication method employing elastic support material holding a plurality of thermally conductive pins, in accordance with an aspect of the present invention. In these embodiments, the thermally conductive pins are shown for simplicity directly contacting an upper surface of an electronic device, such as an integrated circuit chip. Alternatively, the plurality of thermally conductive pins could thermally contact an upper surface of a passivation layer, such as layer 170 of FIG. 1B. The upper surface of the integrated circuit chips, and thus the upper surface of second passivation layer 170 may include one or more concave surface regions or convex surface regions, for example, resulting from thermal cycling of the electronic module.

As used herein, "electronic device" comprises any heat generating component of, for example, a computer system or other electronic system requiring cooling. The term includes one or more integrated circuit devices, semiconductor chips, and/or electronic components, such as depicted in FIGS. 1A & 1B. The "surface to be cooled" refers to a surface of the electronic device itself, or to an exposed surface of a thermal cap, thermal spreader, passivation layer, or other surface in thermal contact with the electronic device, and through which heat generated by the electronic device is to be extracted.

In one embodiment, the cooling assembly and cooling method disclosed herein employ a direct water-based cooling approach with characteristic flow dimensions that do not pose an orifice plugging concern (e.g., employing orifices of 0.5 mm or greater), and which can achieve a high rate of heat removal well in excess of 200 W/cm$^2$. This is achieved by bringing an array of small diameter, thermally conductive pins, for example, fabricated of metal (such as copper), and on the order of 0.5 mm in diameter, in good thermal, planar contact with the surface of the electronic device to be cooled, and by causing the water-based cooling liquid to flow around the pins after impinging upon the surface to be cooled.

Figure 2:
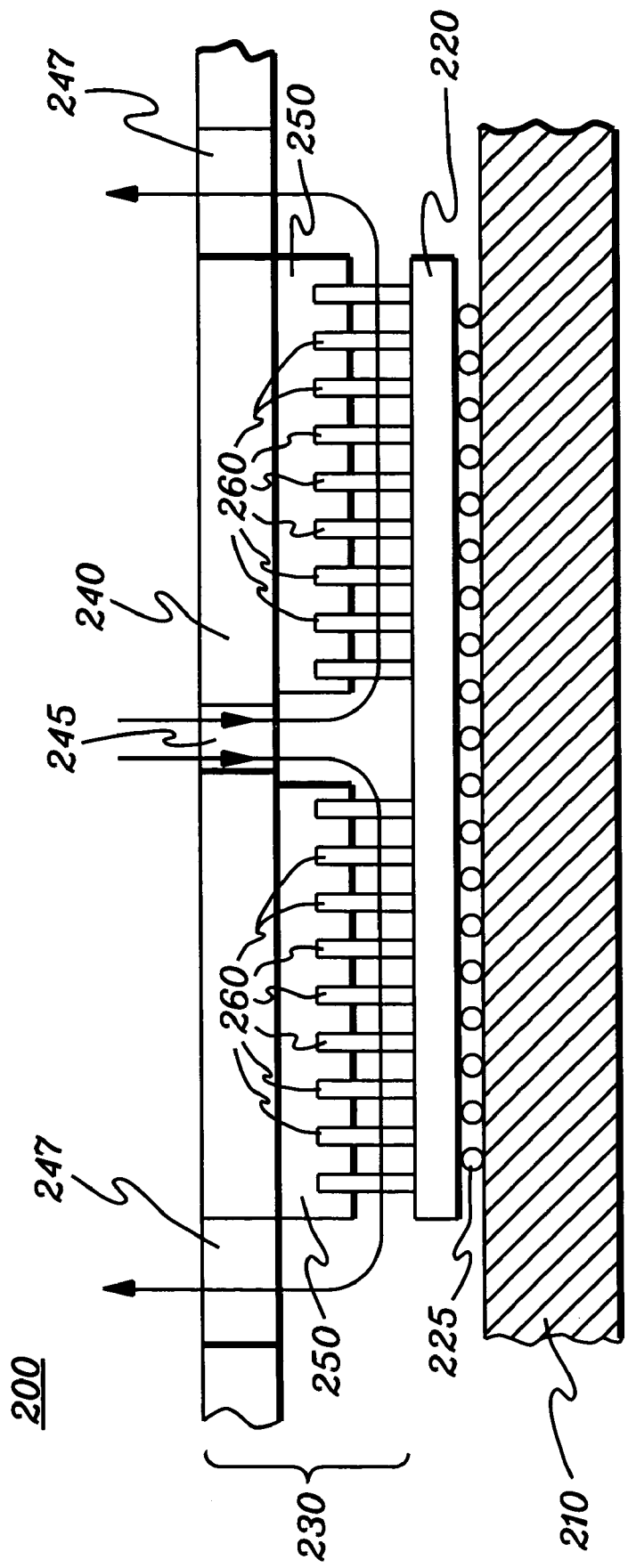
FIG. 2 is a cross-sectional view of one embodiment of a dual-mode conduction/convection cooling assembly, in accordance with an aspect of the present invention.

FIG. 2 depicts a partial cross-sectional view of a dual-mode, conduction and convection cooling assembly in accordance with an aspect of the present invention.

In FIG. 2, an electronic module 200 is partially shown which includes a substrate 210, which may include conductive wiring (not shown) on an upper surface thereof and/or embedded therein. One or more electronic devices 220 are electrically connected to the electrical wiring of substrate 210 via, for example, solder ball connections 225. One embodiment of a cooling assembly, generally denoted 230, is shown in physical contact with an upper surface of electronic device 220. As noted above, the passivated electronic substrate assembly of FIGS. 1A & 1B could be employed to isolate the electronic devices from, for example, water-based coolant. In that case, cooling assembly 230 would be in physical contact with an upper surface of, for example, second passivation layer 170.

Cooling assembly 230 includes a manifold 240 having one or more orifices 245 therein for injecting cooling liquid onto the surface of the electronic device to be cooled. Note that in FIGS. 2–4, only a portion of manifold 240, 440 comprising a rigid jet plate is shown. Further details of the manifold are omitted as being conventional and readily implementable by one skilled in the art. In one embodiment, at least one orifice is provided disposed (e.g., centrally) above each electronic device assembly to be cooled. This allows the injection of cooling fluid directly onto the surface to be cooled for the removal of heat from the electronic device. Outlet orifices 247 are also provided in manifold 240 for removing coolant after passing through the assembly.

In accordance with an aspect of the present invention, an elastic pin support material 250 is provided for holding an array of thermally conductive pins 260. The array of thermally conductive pins are in line or staggered, or of varying density as explained further below. The pins can be fabricated of metal, for example, comprising at least one of copper, chromium, gold, nickel, aluminum, silver, magnesium, titanium and alloys thereof, or non-metal, for example, silicon carbide, diamond, graphite and aluminum nitride, and can comprise monolithic structures of uniform composition. As shown, a first end of each pin of the plurality of thermally conductive pins is embedded within the elastic pin support material, while a second end of each pin, which physically contacts the surface to be cooled, has a planar surface normal to an axis of the pin to allow for good planar contact with the surface, thereby facilitating good thermal interface between the conductive pins and the surface to be cooled.

Elastic pin support material 250, which can be directly attached to a surface of manifold 240, should be selected to have the properties of a reasonable force versus deflection (i.e., compression) characteristic, while at the same time having a low modulus of elasticity to allow each pin to simultaneously translate and rotate in order for the free end of each pin, which is a planar surface, to establish planar contact with the surface to be cooled. The elastic pin support material, which may be bonded to a surface of the manifold, can be formed of a material comprising at least one of polyether, polyester, filter foam, polyethylene, silicone rubber and sponge, cellular urethane foam, silicone foam, latex foam, open cell sponge, slow recovery foam, high density urethane, conductive foam, and rubber based materials. For example, a cellular urethane foam (sponge rubber) such as offered by Pronat Industries, Ltd. of Natanya, Israel could be employed, or a closed cell foam or other rubber based product such as offered by S & S Plastics, Inc. of Newark, N.J. could be employed. Those skilled in the art will note that other elastomeric and rubber-based compliant materials could be substituted for those noted above. Again, the elastic pin support material preferably has a thickness and compliance which facilitates thermal interfacing of the conductive pins to the surface of the electronic device to be cooled by allowing the free ends thereof to move vertically and tilt simultaneously, thus allowing the planar surface of each conductive pin to establish planar contact with the surface to be cooled, notwithstanding that the surface to be cooled may be other than planar, for example, due to curvature on the order of microns of the supporting substrate and/or the electronic device(s) disposed thereon.

Figure 3A:
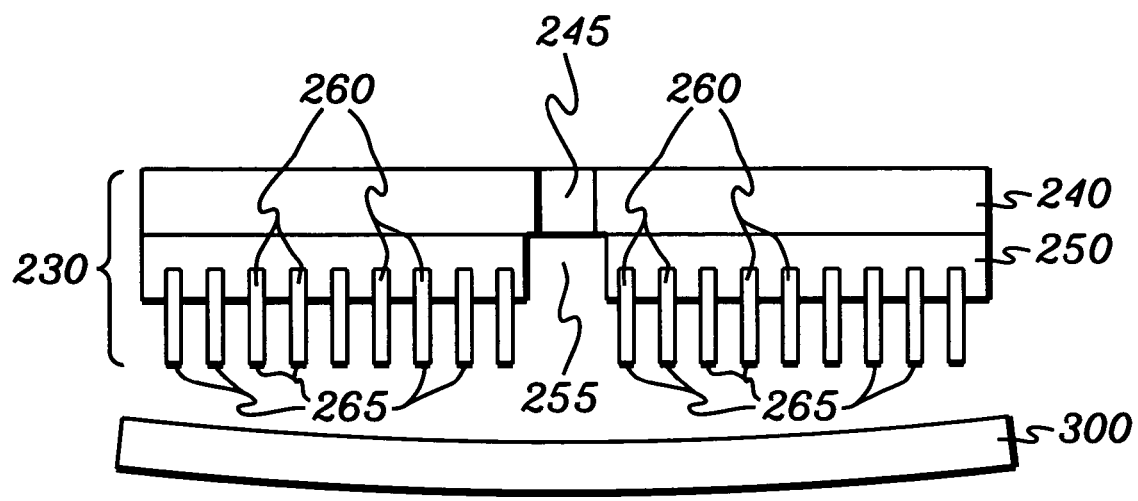
FIG. 3A is a cross-sectional view of one embodiment of the cooling assembly of FIG. 2 shown disposed over a surface of a concave integrated circuit chip, in accordance with an aspect of the present invention.
Figure 3B:
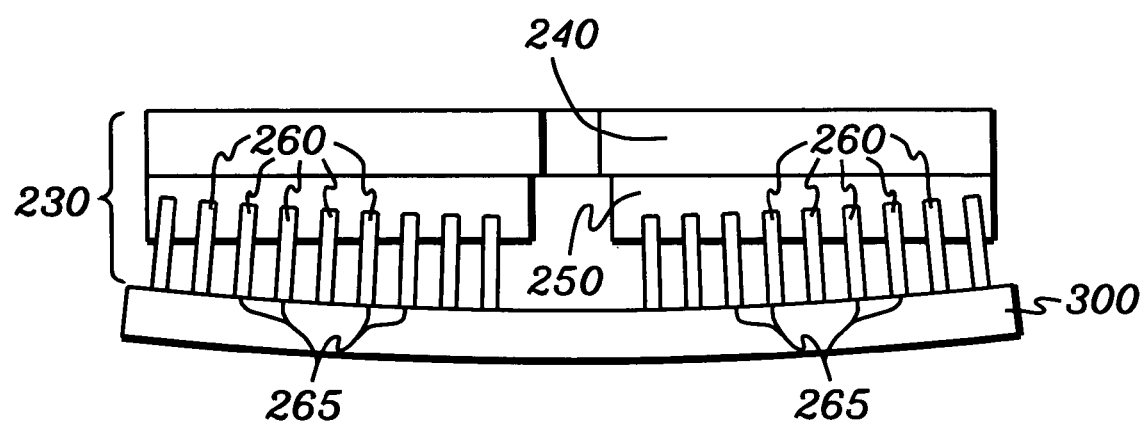
FIG. 3B is a cross-sectional elevational view of the structures of FIG. 3A after the cooling assembly has been brought into physical contact with the surface of the concave integrated circuit chip so that the planar ends of the plurality of thermally conductive pins are each in planar contact with the concave surface, in accordance with an aspect of the present invention.

FIGS. 3A & 3B depict an example of the compliance desired in pin support material 250. In these figures, cooling assembly 230 again includes a manifold 240, having at least one orifice 245 therein and an elastic pin support material 250 bonded to a surface of the manifold. Support material 250 includes an opening 255 which is aligned to the orifice of the manifold 240. A plurality of thermally conductive pins 260 are embedded at a first end within the elastic pin support material 250. The free end of each pin is a planar surface 265. In the example shown, the electronic device 300 (e.g., integrated circuit chip) is shown to have a concave curvature, which measurements have shown can be the case in practice. In addition to accommodating the shape of the surface to be cooled, by conforming to surface tilt, variations in surface height are also simultaneously accommodated by vertical translation of the pins. This can be important for multichip modules where chips may be at different heights. In one embodiment, the variations to be accommodated may be on the order of microns (10 microns or less for a surface of an integrated circuit chip) and approximately 2 mm or less for chip tilt.

Fabrication of the cooling assembly could comprise the thermally conductive pins being inserted into molded holes in the elastic pin support material, or the pins could be molded directly into the material itself as part of the fabrication process, i.e., the thermally conductive pins could be present at the time that the elastic pin support material is molded. The support material could then be bonded, for example, glued or epoxied, to the manifold, which in one embodiment may be made of plastic.

In operation, cooling of an electronic device is achieved by cooling liquid, such as a water-based coolant, entering the electronic module through an inlet plenum and passing through an orifice in the manifold over a surface of an electronic device assembly to be cooled. The orifice can be rectangular (i.e., a slot) or circular in shape. The slot width or circular diameter might be greater than 1 mm, which is significantly larger compared to orifices of 0.25 mm or less described above. The cooling liquid impinges on the surface to be cooled, resulting in a high heat transfer in the vicinity of the orifice, due to the stagnation region below the orifice that is set up about a center line of the impinging fluid with respect to the jet orifice, as is understood in the art. Within this stagnation region, a boundary layer comprises a relatively thin layer atop the impingement surface, meaning that greater heat transfer occurs in this region. However, as the direction and momentum of the fluid changes to passing along the flat impingement surface, the thickness of the boundary layer increases, thereby reducing the heat transfer coefficient between the fluid and the impingement surface. Thus, provided herein are a plurality of thermally conductive pins which serve to conduct heat from the surface of the electronic device to be cooled, and then allow heat to be convected from the pins to the cooling liquid as the liquid passes around the pins parallel along the surface to be cooled.

Figure 4:
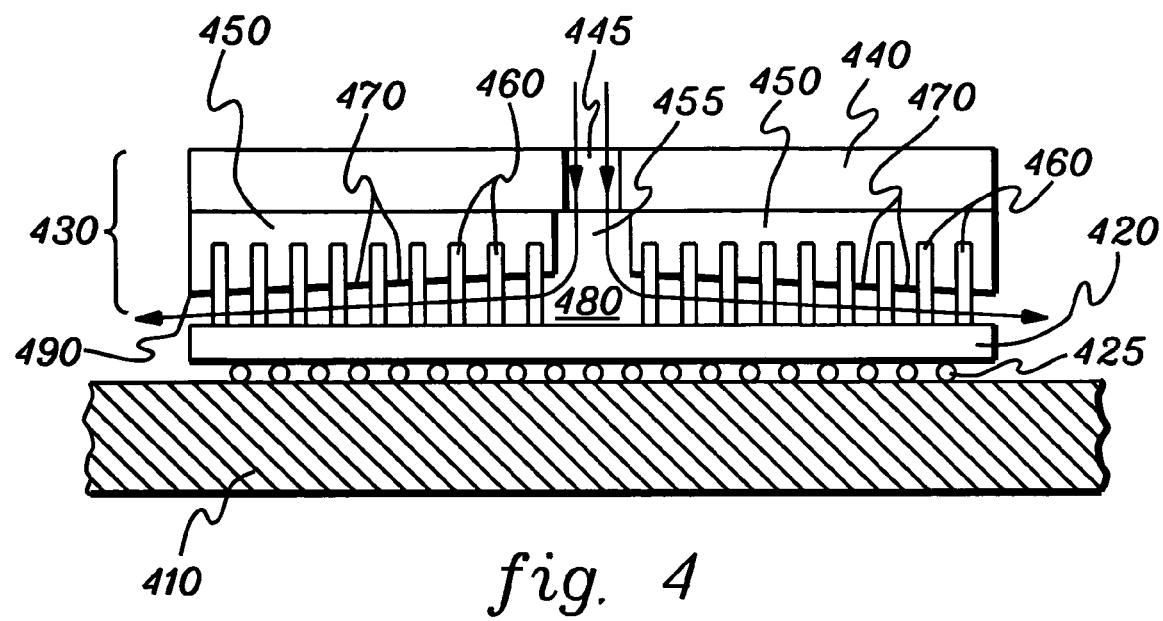
FIG. 4 depicts a partial cross-sectional view of an alternate embodiment of an electronic module having a cooling assembly with an elastic pin support material with a tapered surface opposing the surface to be cooled, thereby defining a converging liquid flow channel from near a center region of the elastic pin support material radially outward, in accordance with an aspect of the present invention.

FIG. 4 illustrates a further embodiment of a cooling assembly, in accordance with an aspect of the present invention. In this embodiment, a substrate 410 again supports one or more electronic devices 420, which are electrically connected to wiring on and/or within the substrate via solder ball connects 425. A cooling assembly 430 includes a manifold 440, an elastic pin support material 450 and a plurality of thermally conductive pins 460, similar to the cooling assembly 230 embodiment of FIG. 2. Manifold 440 has a circular orifice 445 which provides an impinging flow of cooling liquid onto a surface of the electronic device 420 (or, as noted above, onto a passivation layer in good thermal contact with the upper surface of the electronic device). In this embodiment, an exposed surface 470 of the elastic pin support material 450 (i.e., the surface of the support material in opposing relation to the surface of the electronic device assembly to be cooled) is tapered from the periphery 490 thereof to a center region 480 having the opening aligned to the orifice of the manifold through which the cooling fluid is injected. This tapering of the surface 470 of the elastic pin support material forms a converging flow path (i.e., decreasing channel height) as the cooling liquid moves radially outward from the center portion of the cooling assembly, where in this embodiment the circular orifice for injecting cooling fluid is located. Those skilled in the art will understand that other converging flow path geometries are also possible. As the cooling liquid flows radially outward from the impingement or stagnation region, the velocity decreases linearly with distance from the center point (i.e., the radius of the flow). The converging flow path depicted in FIG. 4 is designed to compensate for this decrease in velocity due to the radial flow.

Figure 5:
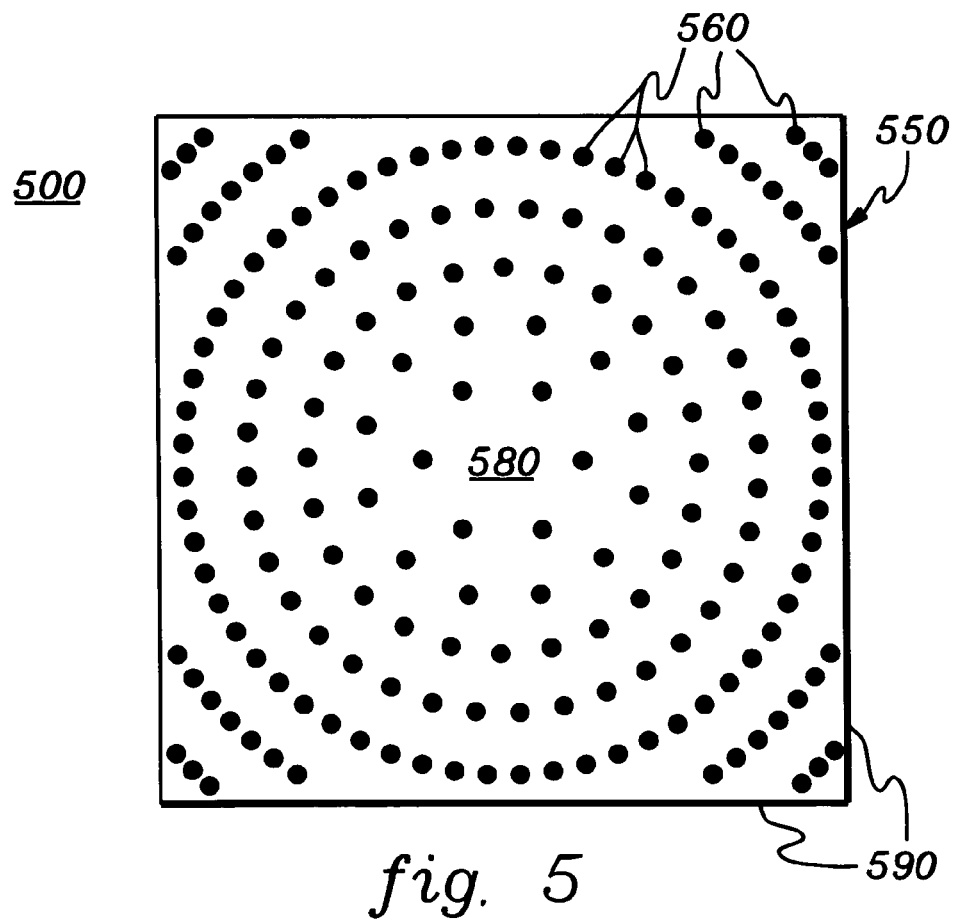
FIG. 5 is a plan view of another embodiment of pin placement within an elastic pin support material of a cooling assembly, wherein density of the plurality of thermally conductive pins increases from a center portion of the support material outward towards the periphery thereof, in accordance with an aspect of the present invention.

As shown in FIG. 5, and as a further alternative, pin density of a cooling assembly 500 could vary from a center region 580 of elastic pin support material 550 to a periphery 590 thereof, with pin 560 density shown increasing radially outward from center region 580 towards periphery 590. Those skilled in the art will note that other surface pin configurations are also possible. In one embodiment, the shape of the exposed surface of the pin support material can approximately mirror the surface configuration shape of the electronic device to be cooled.

By way of more specific example, a cooling assembly in accordance with an aspect of the present invention could employ copper pin-fins embedded within the elastic pin support material for removing heat from the back side of a 1 cm$^2$ integrated circuit chip (approximately 0.75 mm thick). Eighty pins of diameter 0.5 mm could be used, with the pins distributed on a 1 mm pitch. A slot jet might be located centrally in the manifold, enabling impingement of a water-based coolant at a temperature of, for example, 32° C. at a volumetric rate of 0.5 gpm. The separation distance between the jet and the back side of the chip might be fixed at 0.5 mm. Substantial thermal performance is achieved in the range of 400–500 W/cm$^2$, at a pressure drop of approximately 8.5 psi, when the temperature difference between the hottest part of the chip and the inlet coolant, is 60° C. For example, a pin-chip interface with water-based coolant as the interstitial fluid and a bond line of 1 micron exhibits a unit resistance of 1.6° C.-mm$^2$/W. By way of comparison, solder or epoxy joints are not expected to be better than 5° C.-mm$^2$/W.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling assembly for an electronic device, the cooling assembly comprising:
   a manifold having at least one orifice therein for injecting a cooling liquid onto a surface to be cooled, the surface comprising one of a surface of the electronic device or a surface in thermal contact with the electronic device;
   an elastic pin support material having at least one opening aligned to the at least one orifice of the manifold for allowing the cooling liquid to pass therethrough; and
   a plurality of thermally conductive pins mounted within the elastic pin support material and extending therefrom, the plurality of thermally conductive pins being sized to physically contact the surface to be cooled when the cooling assembly is employed to cool the electronic device, wherein the plurality of thermally conductive pins include first ends embedded within the elastic pin support material, and wherein the elastic pin support material has a thickness and compliance which facilitates thermal interfacing of the plurality of thermally conductive pins to the surface to be cooled by allowing second ends thereof to move vertically and tilt, wherein the second end of each thermally conductive pin comprises a planar surface which is normal to an axis of the thermally conductive pin, and wherein when the cooling assembly is employed to cool the electronic device, the elastic pin support material facilitates the planar surfaces of the second ends of the plurality of thermally conductive pins establishing planar contact with the surface to be cooled, notwithstanding that the surface may be other than planar.

2. The cooling assembly of claim 1, wherein the surface to be cooled includes at least one of a concave surface region and convex surface region, and wherein the elastic pin support material allows thermally conductive pins of the plurality of thermally conductive pins aligned over the at least one convex surface region or concave surface region to move vertically and tilt so that the planar second ends thereof are in planar contact with the surface.

3. The cooling assembly of claim 1, wherein each thermally conductive pin of the plurality of thermally conductive pins comprises a monolithic structure of uniform composition.

4. The cooling assembly of claim 3, wherein each thermally conductive pin comprises either a metal, comprising at least one of copper, chromium, gold, nickel, aluminum, silver, magnesium and alloys thereof, or a non-metal, comprising at least one of silicon carbide, diamond, graphite and aluminum nitride.

5. The cooling assembly of claim 1, wherein the elastic pin support material is bonded to a surface of the manifold, wherein the elastic pin support material is formed of a material comprising at least one of polyether, polyester, filter foam, polyethylene, silicone rubber and sponge, cellular urethane foam, silicone foam, latex foam, open cell sponge, slow recovery foam, high density urethane, conductive foam, and rubber based materials.

6. The cooling assembly of claim 1, wherein the electronic device comprises at least one integrated circuit chip, and wherein the surface to be cooled comprises one of a surface of the at least one integrated circuit chip or a surface in thermal contact with the at least one integrated circuit chip.

7. The cooling assembly of claim 1, wherein density of the plurality of thermally conductive pins mounted within the elastic pin support material varies from a center region of the elastic pin support material to a periphery thereof.

8. The cooling assembly of claim 7, wherein density of the plurality of thermally conductive pins increases from the center region of the elastic pin support material to the periphery thereof.

9. The cooling assembly of claim 1, wherein the plurality of thermally conductive pins are mounted within the elastic pin support material at an exposed surface thereof, and wherein the exposed surface of the elastic pin support material is tapered from a periphery of the elastic pin support material to a center region thereof, wherein when the cooling assembly is employed to cool the electronic device, with the plurality of thermally conductive pins in physical contact with the surface to be cooled, the tapered exposed surface of the elastic pin support material and the surface to be cooled form a converging channel from a region aligned to the center of the elastic pin support material to a region at the periphery of the elastic pin support material.

10. The cooling assembly of claim 9, wherein density of the plurality of thermally conductive pins increases from the center region of the elastic pin support material to the periphery thereof.

11. An electronic module comprising:
    a substrate;
    at least one electronic device to be cooled disposed above the substrate;
    a cooling assembly for the at least one electronic device, the cooling assembly comprising:
       a manifold having at least one orifice therein for injecting a cooling liquid onto a surface to be cooled, the surface comprising one of a surface of the at least one electronic device or a surface in thermal contact with the at least one electronic device;
       an elastic pin support material, the elastic pin support material having at least one opening aligned to the at least one orifice of the manifold for allowing the cooling liquid to pass therethrough; and
       a plurality of thermally conductive pins mounted within the elastic pin support material and extending therefrom, the plurality of thermally conductive pins physically contacting the surface to be cooled, wherein the plurality of thermally conductive pins include first ends embedded within the elastic pin support material, and wherein the elastic pin support material has a thickness and compliance which facilitates thermal interfacing of the plurality of thermally conductive pins to the surface to be cooled by allowing second ends thereof to move vertically and tilt, wherein the second end of each thermally conductive pin comprises a planar surface which is normal to an axis of the thermally conductive pin, and wherein the elastic pin support material facilitates the planar surfaces of the second ends of the plurality of thermally conductive pins being in planar contact with the surface to be cooled, notwithstanding that the surface may be other than planar.

12. The electronic module of claim 11, wherein the surface to be cooled includes at least one of a concave surface region and a convex surface region, and wherein the elastic pin support material allows thermally conductive pins of the plurality of thermally conductive pins aligned over the at least one convex surface region or concave surface region to move vertically and tilt so that the planar second ends thereof are in planar contact with the surface to be cooled.

13. The electronic module of claim 11, wherein each thermally conductive pin of the plurality of thermally conductive pins comprises a monolithic structure of uniform composition.

14. The electronic module of claim 13, wherein each thermally conductive pin comprises either a metal, comprising at least one of copper, chromium, gold, nickel, aluminum, silver, magnesium, titanium and alloys thereof, or a non-metal, comprising at least one of silicon carbide, diamond, graphite and aluminum nitride.

15. The electronic module of claim 11, wherein the elastic pin support material is bonded to a surface of the manifold, and wherein the elastic pin support material is formed of a material comprising at least one of polyether, polyester, filter foam, polyethylene, silicone rubber and sponge, cellular urethane foam, silicone foam, latex foam, open cell sponge, slow recovery foam, high density urethane, conductive foam, and rubber based materials.

16. The electronic module of claim 11, wherein density of the plurality of thermally conductive pins mounted within the elastic pin support material varies from a center region of the elastic pin support material to a periphery thereof.

17. The electronic module of claim 16, wherein density of the plurality of thermally conductive materials increases from the center region of the elastic pin support material to the periphery thereof.

18. The electronic module of claim 11, wherein the plurality of thermally conductive pins are mounted within the elastic pin support material at an exposed surface thereof, and wherein the exposed surface of the elastic pin support material is tapered from a periphery of the elastic pin support material to a center region thereof, wherein the tapered exposed surface of the elastic pin support material and the surface to be cooled form a converging channel from a region aligned to the center of the elastic pin support material to a region at the periphery of the elastic pin support material.

19. The electronic module of claim 18, wherein density of the plurality of thermally conductive pins increases from the center of the elastic pin support material to the periphery thereof.

20. The electronic module of claim 11, wherein the at least one electronic device comprises at least one integrated circuit chip, and wherein the electronic module further comprises a metal barrier, said metal barrier having:
- a perimeter area, said barrier perimeter area being sealably affixed to said substrate at its periphery;
- an integrated circuit chip contact area, said integrated circuit chip contact area being bonded and thermally coupled to an upper surface of said at least one integrated circuit chip; and
- wherein said surface to be cooled comprises a surface of the metal barrier in the integrated circuit chip contact area.

21. A method of fabricating a cooling assembly for an electronic device, the method comprising:
- providing a manifold having at least one orifice for injecting a cooling liquid onto a surface to be cooled, the surface comprising one of a surface of the electronic device or a surface in thermal contact with the electronic device; and
- providing an elastic pin support material having a plurality of thermally conductive pins mounted therein and extending therefrom, the elastic pin support material having at least one opening aligned to the at least one orifice of the manifold for allowing the cooling liquid to pass therethrough, the plurality of thermally conductive pins being sized to physically contact the surface to be cooled when the cooling assembly is employed to cool the electronic device, wherein the elastic pin support material has a thickness and compliance which facilitates thermal interfacing of the plurality of thermally conductive pins to the surface to be cooled by allowing second ends thereof to move vertically and tilt, wherein the second end of each thermally conductive pin comprises a planar surface which is normal to an axis of the thermally conductive pin, and wherein the elastic pin support material facilitates the planar surfaces of the second ends of the plurality of thermally conductive pins establishing planar contact with the surface to be cooled, notwithstanding that the surface may be other than planar.

22. The method of claim 21, wherein each thermally conductive pin of the plurality of thermally conductive pins comprises a monolithic structure of uniform composition.

23. The method of claim 21, further comprising employing the cooling assembly to cool the electronic device, the employing including injecting cooling liquid onto the surface to be cooled wherein the plurality of thermally conductive pins conduct heat from the surface to be cooled and the cooling liquid removes heat from the surface to be cooled and from the plurality of thermally conductive pins by convection.

24. The method of claim 21, wherein the plurality of thermally conductive pins are mounted within the elastic pin support material at an exposed surface thereof, and wherein the exposed surface of the elastic pin support material is tapered from a periphery of the elastic pin support material to a center region thereof, wherein when the plurality of thermally conductive pins are in physical contact with the surface to be cooled, the tapered exposed surface of the elastic pin support material and the surface to be cooled, form a converging channel from a center region of the elastic pin support material to a region at the periphery of the elastic pin support material.

25. The method of claim 24, wherein density of the plurality of thermally conductive pins increases from the center region of the elastic pin support material to the periphery thereof.

26. The method of claim 21, wherein the electronic device comprises part of an electronic module, the electronic module comprising a substrate having a perimeter area, and the electronic device is disposed above the substrate, and wherein the method further comprises:
- sealably affixing a metal barrier to said substrate perimeter area;
- bonding and thermally coupling said metal barrier to the electronic device contact area; and
- wherein said surface to be cooled comprises a surface of the metal barrier in the device contact area.

* * * * *